(12) United States Patent
Gulcur et al.

(10) Patent No.: US 11,041,567 B2
(45) Date of Patent: Jun. 22, 2021

(54) ELASTOMERIC SEAL

(71) Applicant: PRECISION POLYMER ENGINEERING LTD., Blackburn (GB)

(72) Inventors: Murat Gulcur, Blackburn (GB); Christopher Julian Thornton, Blackburn (GB); Paul Andrew Haworth, Blackburn (GB); John Edward Kerwin, Blackburn (GB)

(73) Assignee: PRECISION POLYMER ENGINEERING LTD., Blackburn (GB)

( * ) Notice: Subject to any disclaimer, the term of this patent is extended or adjusted under 35 U.S.C. 154(b) by 25 days.

(21) Appl. No.: 16/099,230

(22) PCT Filed: May 6, 2016

(86) PCT No.: PCT/GB2016/051305
§ 371 (c)(1),
(2) Date: Nov. 6, 2018

(87) PCT Pub. No.: WO2017/191425
PCT Pub. Date: Nov. 9, 2017

(65) Prior Publication Data
US 2019/0154155 A1    May 23, 2019

(51) Int. Cl.
*F16J 15/12* (2006.01)
*F16J 15/10* (2006.01)
(Continued)

(52) U.S. Cl.
CPC ........... *F16J 15/128* (2013.01); *C09D 11/037* (2013.01); *C09D 11/101* (2013.01);
(Continued)

(58) Field of Classification Search
CPC .. F16J 15/128; F16J 15/12; F16J 15/10; F16J 15/102; F16J 15/104; F16J 15/106;
(Continued)

(56) References Cited

U.S. PATENT DOCUMENTS

| 3,975,292 A * | 8/1976 | Shaffer ................... B01D 1/14 516/7 |
| 2007/0098978 A1 * | 5/2007 | Tanaka ................. G02F 1/1339 428/336 |

(Continued)

FOREIGN PATENT DOCUMENTS

| JP | H11 274793 A | 10/1999 |
| JP | 2005-519152 A | 6/2005 |

(Continued)

OTHER PUBLICATIONS

Singapore Written Opinion of the corresponding Singapore Application No. 11201809796R, dated Jan. 21, 2020, 6 pages.
(Continued)

*Primary Examiner* — Nathan Cumar
(74) *Attorney, Agent, or Firm* — Tucker Ellis LLP; Michael G. Craig; Heather M. Barnes (57) ABSTRACT

An elastomeric seal for use in semiconductor manufacturing apparatus comprising an ink on at least a portion of the upper surface thereof, wherein the ink comprises a barrier material, the barrier material being operable to prevent or reduce degradation of the elastomeric seal from ultraviolet (UV) radiation.

15 Claims, 3 Drawing Sheets

(51) Int. Cl.
*H01L 21/67* (2006.01)
*C23C 16/44* (2006.01)
*C09D 11/037* (2014.01)
*C09D 11/101* (2014.01)
*C09D 11/107* (2014.01)

(52) U.S. Cl.
CPC ........ *C09D 11/107* (2013.01); *C23C 16/4409* (2013.01); *F16J 15/102* (2013.01); *H01L 21/67115* (2013.01); *H01L 21/67126* (2013.01)

(58) Field of Classification Search
CPC ........... F16J 2015/0856; C09D 11/037; C09D 11/00; C09D 11/101; C23C 16/4409; C23C 16/00; H01L 21/67115; H01L 21/67126
USPC ......................................................... 277/653
See application file for complete search history.

(56) References Cited

U.S. PATENT DOCUMENTS

| | | | | |
|---|---|---|---|---|
| 2008/0187430 A1* | 8/2008 | Datta | ................ | H01L 21/67126 414/805 |
| 2014/0117629 A1* | 5/2014 | Biallas | .................... | C23C 14/20 277/653 |
| 2015/0279706 A1* | 10/2015 | Nakagawa | ............. | F16J 15/128 277/641 |
| 2016/0030304 A1* | 2/2016 | Nagamatsu | ............. | A61K 8/25 424/401 |

FOREIGN PATENT DOCUMENTS

| | | |
|---|---|---|
| TW | 200528547 A | 9/2005 |
| TW | 201423880 A | 6/2014 |
| WO | 2013184231 A1 | 12/2013 |
| WO | 2014057803 A1 | 4/2014 |

OTHER PUBLICATIONS

Singapore Search Report of the corresponding Singapore Application No. 11201809796R, dated Jan. 21, 2020, 2 pages.

PCT International Search Report from the International Application No. PCT/GB2016/051305, dated Jan. 23, 2017.

Office Action from corresponding Japanese Application No. 2018-558209 dated Jul. 7, 2020.

Office Action from corresponding Taiwanese Application No. 106114982 dated May 29, 2020.

* cited by examiner

ELASTOMERIC SEAL

CROSS-REFERENCE TO RELATED APPLICATIONS

This application claims priority to International Application No. PCT/GB2016/051305 filed May 6, 2016, which is hereby incorporated herein by reference.

BACKGROUND

Sealing elements such as elastomeric seals are well known in the art. A wide variety of elastomeric seals have been developed for use in sealing applications in many different industries. The seals are useful to provide sealing properties by joining systems and/or mechanisms together, preventing leakage by blocking the passage of fluids or gases, containing pressure within a system and/or excluding contamination. Such elastomeric seals need to have certain properties such as having high sealing efficiency, low surface permeability and high durability. In addition, the seals must demonstrate excellent mechanical properties, for example, a high modulus of elasticity, strength and flexibility. When utilised in certain applications, the elastomeric seals need to have specific additional properties. For example, in the oil and gas industries, the seals need to demonstrate properties suitable to withstand a wide range of temperatures, in addition to resistance to certain gases, for example, sour gases. In semiconductor applications, the seals must additionally demonstrate resistance to both UV radiation and etch processes, such as those involving plasma and strong acids.

Elastomeric seals are often utilised as high performance sealing elements in semiconductor manufacturing apparatus to prevent air or other process gases from entering and/or leaving the apparatus. Such elastomeric seals must be suitable to withstand the conditions utilised therein. Specifically, the seals are utilised in wafer processing applications, such as the UV curing of crosslinkable materials and low dielectric layer deposition which expose the elastomeric seals to UV radiation. Many of the elastomeric seals currently utilised as sealing elements in such applications demonstrate limited protection against the UV radiation used therein, such that the exposed surfaces of the seals are damaged as a result of photo-absorption and lose their sealing properties. Accordingly, many of the known elastomeric seals used in semiconductor manufacturing apparatus demonstrate limited lifetimes and necessitate frequent replacement, causing the efficiency of operation of the apparatus to be distinctly reduced and costs significantly increased.

There is therefore a desire to produce elastomeric seals that demonstrate increased lifetimes when exposed to UV radiation, particularly when utilised in semiconductor manufacturing apparatus.

SUMMARY

The present invention relates to an elastomeric seal. In particular, the present invention relates to an elastomeric seal having an ink deposited thereon, suitable for use in sealing applications, particularly for sealing applications in which ultraviolet (UV) radiation is used, such as in semiconductor manufacturing apparatus, for example, to provide protection against degradation caused by UV radiation.

According to a first aspect of the present invention there is provided an elastomeric seal for use in semiconductor manufacturing apparatus comprising an ink on at least a portion of the upper surface thereof, wherein the ink comprises a barrier material, the barrier material being operable to prevent or reduce degradation of the elastomeric seal from ultraviolet (UV) radiation.

Preferably, the elastomeric seal according to the present invention is generally elongate, preferably comprising a continuous loop operable to fit into a channel. Preferably, the elastomeric seal comprises a longitudinal axis along its length. Preferably, the elastomeric seal comprises an inner edge and an outer edge.

Preferably, the elastomeric seal comprises a lower portion and preferably, an upper portion. Preferably, the lower portion is operable to fit into a channel. Preferably, the lower portion fits into the channel via friction fit. Preferably, the upper portion of the elastomeric seal protrudes from the channel into which the lower portion is operable to fit. Preferably, the upper portion comprises an upper surface. The upper surface may be exposed to UV radiation, in use.

Preferably, the dimensions of the channel correspond to the dimensions and shape of the elastomeric seal. Preferably, the dimensions of the channel correspond to the dimensions and shape of the lower portion of the elastomeric seal. In one embodiment, the channel may form a continuous loop that generally corresponds to that of the elastomeric seal.

The elastomeric seal may be generally cylindrical. The elastomeric seal may be generally circular in cross section perpendicular to the longitudinal axis. The cross section of the seal perpendicular to the longitudinal axis may have a width, or diameter if circular, that generally corresponds to the width of the channel into which the lower portion of the seal is operable to be fitted. The generally circular cross section of the elastomeric seal perpendicular to the longitudinal axis may have a width, or diameter if circular, from about 0.3 mm to 28 mm, suitably from about 1 mm to 20 mm, such as from about 1.5 to 10 mm, for example from about 1.78 mm to 6.99 mm.

The lower portion of the elastomeric seal may be generally oval or part oval in cross section perpendicular to the longitudinal axis of the seal. The lower portion of the elastomeric seal may comprise an inner edge and an outer edge. The upper portion of the elastomeric seal may be generally rectangular in cross section perpendicular to the longitudinal axis of the seal and operable to sit on top of the lower portion to generally make a conjoined shape. The upper portion may comprise an upper surface. The upper surface may include at least two of the corners of the generally rectangular upper portion. At least two corners of the seal generally rectangular upper portion may be curved. The upper portion of the elastomeric seal may comprise an inner edge and an outer edge. The width of the upper portion of the elastomeric seal may be wider than the width of the lower portion of the elastomeric seal. The point of attachment between the lower portion and the upper portion of the elastomeric seal may be narrower than the width of the lower portion of the elastomeric seal. The cross section of the lower portion of the elastomeric seal perpendicular to the longitudinal axis may have a width that generally corresponds to the width of the channel into which the lower portion is operable to be fitted. The width of the upper portion may be wider than that of the channel into which the lower portion of the elastomeric seal is operable to be fitted. The inner and outer edges of the upper portion of the elastomeric seal may be operable to overlap the edges of the channel into which the lower portion is operable to be fitted. The generally oval or part oval cross section of the elastomeric seal perpendicular to the longitudinal axis may have a width from about 0.3 mm to 28 mm, suitably from about 1 mm to 20 mm, such as from about 1.5 to 10 mm, for example from about 1.78 mm to 6.99 mm. The generally rectangular cross section of the upper portion of the elastomeric seal perpendicular to the longitudinal axis may have a width from about 0.5 mm to 30 mm, suitably from about 1 mm to 20 mm, such as from about 1.5 to 10 mm, for example from about 2 mm to 7 mm. suitably as from about 0.5 mm to 2 mm, such as from about 7 mm to 30 mm and a thickness from about 1 mm to 5 mm, suitably as from about 0.5 mm 1 to 1 mm, such as from about 5 mm to 20 mm.

The elastomeric seal may be a face seal, lip seal, D-seal, X seal, T-Seal, cap seal, wiper seal, energising lip seal or spring seal and wafer handling elastomeric parts such as end effector pads or suction cups.

The elastomeric seal may be formed from any suitable elastomeric material. Preferably, such elastomeric materials may comprise a polymeric material. Preferably, such polymeric materials comprise a fluoropolymer material comprising one or more homopolymers or copolymers derived from combinations of monomers comprising fluorine and optionally, other suitable additional monomers. Examples of suitable monomers comprising fluorine include, but are not limited to one or more of the following: vinylidene fluoride (VDF); hexafluoropropylene (HFP); tetrafluoroethylene (TFE); perfluoromethylvinylether (PMVE) or combinations thereof. Examples of suitable additional monomers include, but are not limited to one or more of the following: ethylene, propylene or combinations thereof.

Preferably, the polymeric material comprises tetrafluoroethylene-perfluoromethylvinylether (FFKM) or any other perfluorinated or fully fluorinated elastomer material. The elastomer used may be Perlast® G67P, Perlast® G75P, Perlast® G70H, Perlast® G75H, Perlast®G67G, Perlast®G70F, Perlast®G74S, Perlast®G75B, Perlast® G75TP, Perlast®G75TX, Perlast®G76W Perlast®G80A, Perlast®G80D, Perlast®G90DM, Perlast®G90LT, Perlast®G92E, Perlast®G100XT, Perlast®G70A, Perlast®G76G, Perlast®G79G available from Precision Polymer Engineering also including other commercially available perfluoroelastomers. Non-perfluorinated elastomer materials used may be Nanofluor® Y75G, Nanofluor® Y75N, Nanofluor®Y80G, V75SC, V90DM, V75J available from Precision Polymer Engineering also including other commercially available perfluoroelastomers.

The polymeric material may be present in the elastomeric material in any suitable amount. In certain embodiments, the elastomeric material may comprises from about 40 to 100 wt %, suitably from about 80 to 95 wt % or even from about 90 to 98 wt % of the polymeric material based on the total solid weight of the elastomeric material.

Preferably, the elastomeric material may further comprise one or more crosslinking materials. Suitable crosslinking materials will be well known to a person skilled in the art.

In certain embodiments, the crosslinking material may comprise a peroxide or nitrilic curing systems.

The crosslinking material may be present in the elastomeric material in any suitable amount. In certain embodiment, the elastomeric material may comprise from about 0.2 to 5.0 wt %, suitably from about 0.5 to 1.2 wt %, or even from about 0.7 to 2.0 wt % of the crosslinking material based on the total solid weight of the elastomeric material.

Preferably, the elastomeric material may further comprise fillers and other process additives. The filler used in the elastomer compound formulation may be silicon dioxide, aluminium dioxide, titanium dioxide and kaolin. The particle size of the filler can be from about 1 nm to 5000 nm suitably from 10 nm to 200 nm or even 5 nm to 35 nm. Other additives used in the elastomer compound formulation may be pigments, process oils etc. The components may be present in the elastomeric material in any suitable amount.

The elastomeric material may have any suitable hardness. In certain embodiments, the elastomeric material may have a hardness from about 30 Shore A to 90 Shore A, suitably from 60 Shore A to 75 Shore A, or even from 75 Shore A to 85 Shore A.

Hardness may be measured by any suitable method. Techniques to measure hardness will be well known to a person skilled in the art. The hardness values and ranges given herein are as determined by the methods listed in "ISO 48—Rubber, vulcanized or thermoplastic—Determination of indentation hardness—Part 1: Durometer method (Shore hardness)" or "ASTM D2240 Standard Test Method for Rubber Property-Durometer Hardness" international standards.

The elastomeric material may have any suitable tensile strength. In certain embodiments, the elastomeric material may a tensile strength from about 3 to 30 Mega-Pascal (MPa), suitably from about 10 to 15 MPa, or even from about 12 to 20 MPa.

Tensile strength may be measured by any suitable method. Techniques to measure tensile strength will be well known to a person skilled in the art. The tensile strength values and ranges given herein are as determined by "ISO 37—Rubber, vulcanized or thermoplastic—Determination of tensile stress-strain properties" or "ASTM D412 Standard Test Methods for Vulcanized Rubber and Thermoplastic Elastomers-Tension" international standards.

The elastomeric material may have any suitable modulus of elasticity. In certain embodiments, the elastomeric material may have a modulus of elasticity at 100% elongation of about 0.5 to 15 Megapascal (MPa), suitably from about 2 to 8 MPa or even from about 3 to 5 MPa.

Modulus of elasticity may be measured by any suitable method. Techniques to measure modulus of elasticity will be well known to a person skilled in the art. The modulus of elasticity values and ranges given herein are as determined by "ISO 37—Rubber, vulcanized or thermoplastic—Determination of tensile stress-strain properties" or "ASTM D412 Standard Test Methods for Vulcanized Rubber and Thermoplastic Elastomers-Tension" international standards.

The elastomeric material may have any suitable compression set. In certain embodiments, the elastomeric material may have a compression set after 24 hours at 200° C. with 25% deflection from about 5% to 50%, such as from 15% to 25%, or even from about 8% to 14%.

The compression set may be measured by any suitable method. Techniques used to measure compression set will be well known to a person skilled in the art. The compression set values and ranges given herein are as determined by "ISO 815-1—Rubber, vulcanized or thermoplastic—Determination of compression set—Part 1: At ambient or elevated temperatures" or "ASTM D395—Standard Test Methods for Rubber Property-Compression Set.

The elastomeric material may comprise commercially available elastomeric materials. Examples of suitably commercially available elastomeric materials include, but are not limited to one or more of the following: Perlast® G67P, Perlast® G75P, Perlast® G70H, Perlast® G75H, Perlast®G67G, Perlast®G70F, Perlast®G74S, Perlast®G75B, Perlast® G75TP, Perlast®G7 STX, Perlast®G76W Perlast®G80A, Perlast®G80D, Perlast®G90DM, Perlast®G90LT, Perlast®G92E, Perlast®G1 OOXT, Perlast®G70A, Perlast®G76G, Perlast®G79G available from Precision Polymer Engineering but not limited to other perfluoroelastomer available in the market,) Non-perfluorinated elastomer materials used may be Nanofluor® Y75G, Nanofluor® Y75N, Nanofluor®Y80G, V75SC, V90DM, V75J available from Precision Polymer Engineering but not limited to other fluoroelastomers available in the market or combinations thereof.

Preferably, the ink on at least a portion of the upper surface of the elastomeric seal comprises a barrier material operable to prevent or reduce degradation of the elastomeric seal from UV radiation. Preferably, the ink comprises a barrier material, binder and optionally, a solvent.

The barrier material may comprise metallic particles. Examples of suitable metallic particles include, but are not limited to the following: aluminium, silver, nickel, titanium, zinc, gold, copper or combinations thereof. The metallic particles are incorporated into the ink in the form of flakes. Preferably, the metal particles are aluminium.

The metal particles may have any suitable average particle size. In certain embodiments, the metal particles may have an average particle size of from about 0.5 to 75 microns, suitably from about 15 to 40 microns.

The average particle size may be measured by any suitable method. Techniques to measure the average particle size will be well known to a person skilled in the art. The average particle size values and ranges given herein are as determined by scanning electron microscopy.

The barrier material may comprise inorganic compounds, which may be pigments. Examples of suitable inorganic compounds include, but are not limited to the following: titanium dioxide, aluminium dioxide, carbon black or combinations thereof. The inorganic compounds may be incorporated into the ink as powder and dispersed in suitable amount in solvent.

The inorganic compounds may have any suitable average particle size. In certain embodiments, the inorganic compounds may have an average particle size of from about 0.1 to 10 microns, suitably from about 2 to 8 microns, or even from about 2 to 5 microns.

A person skilled in the art will appreciate that methods used for measuring the average particle size of the metal particles may also be used to measure the average particle size of the inorganic compounds.

Preferably, the binder may comprise a resin carrier. Examples of suitable resin carriers include heat curable acrylate and epoxy acrylate type low and medium viscosity resins available from Sartomer® Arkema, Lucite International® or any other manufacturer.

Optionally, the ink may further comprise a solvent. Examples of suitable solvents include toluene, cycloheaxonone, acetone, methyl ethyl ketone, tetrahydrofuran, hexane, xylene, methylene chloride, tetrachloromethane. Preferably, the ink is a solution or suspension. Preferably, the solvent is 1:1 (wt) mixture of toluene and acetone.

The barrier material may be present in the ink in any suitable amount. In certain embodiments, the ink may comprise from about 10 to 75 wt %, such as from about 10 to 25%.

The resin binder may be present in the ink in any suitable amount. In certain embodiments, the ink may comprise from about 0 to 25 wt %, such as from about 5 to 20 wt % of resin.

In certain embodiments, the solid composition content of the coating composition is at least 25% and suitably less than 85%.

Preferably, the ink may be applied onto the elastomeric seal, suitably a portion of the upper surface thereof, to any suitable dry film thickness. In certain embodiments, the ink may be deposited to a dry film thickness of from about 0.1 nm to 500 μm (microns), such as from about 1 nm to 100 nm, or even from about 5 μm to 50 μm. In certain embodiments, the ink may be deposited to a dry film thickness from about 5 μm to 100 μm, suitably from about 5 μm to 10 μm.

The ink may be applied to the elastomeric seal by any suitable method. Methods of applying the ink will be well known to a person skilled in the art. Suitable deposition methods include, but are not limited to the following: screen printing, ink jet printing, spray printing or combinations thereof. Preferably, all or a portion of the upper surface may be covered.

The ink may be applied to the elastomeric seal as a single layer or as part of a multi-layer system. In certain embodiments, the ink may be applied on top of a primer or as the primer layer itself. The ink may form a top coat layer. The ink may be applied to the upper surface of the elastomeric seal once or multiple times.

In certain embodiments, the ink may be cured on the elastomeric seal by a heat curing process. Suitably, the ink composition may be cured at a temperature from about 50 to 250° C., such as about 175 to 250° C. Preferably, the ink compositions are heat cured for a period of time from about 15 minutes to 24 hours.

Preferably, the ink is operable to prevent or reduce degradation of the seal from ultraviolet (UV) radiation. Preferably, the ink is operable to prevent or reduce degradation of the seal from short wave ultraviolet (UV) radiation.

Preferably, the elastomeric seal according to the present invention comprising an ink deposited on at least a portion of the upper surface thereof is suitable for use in semiconductor manufacturing apparatuses and semiconductor manufacturing processes.

According to a second aspect of the present invention there is provided a method of forming an elastomeric seal for use in semiconductor manufacturing apparatus comprising depositing an ink on at least a portion of an upper surface thereof, wherein the ink comprises a barrier material, the barrier material being operable to prevent or reduce degradation of the seal from ultraviolet (UV) radiation.

According to a further aspect of the present invention, there is provided a method of preventing or reducing degradation of an elastomeric seal by ultraviolet (UV) radiation, the method comprising depositing an ink on at least a portion of an upper surface of the said elastomeric seal, wherein the ink comprises a barrier material, the barrier material being operable to prevent or reduce degradation of the elastomeric seal from ultraviolet (UV) radiation.

By the term ultraviolet (UV) radiation utilised herein is meant UV radiation having a wavelength in the region of 10-400 nm.

By the term short wave ultraviolet (UV) radiation herein is meant UV radiation having a wavelength in the region of 100-280 nm and 280-315 nm, commonly known as UVC and UVB.

As used herein, the singular includes the plural and plural encompasses singular, unless specifically stated otherwise. For example, the use of the singular, i.e. "a" or "an", includes "one or more". In addition, as used herein, the use of "or" means "and/or" unless specifically stated otherwise, even though "and/or" may be explicitly used in certain instances.

All of the features contained herein may be combined with any of the above aspects and in any combination.

BRIEF DESCRIPTION OF DRAWINGS

For a better understanding of the invention and to show how embodiments of the same may be carried into effect, reference will now be made, by way of example, to the accompanying diagrammatic diagrams in which.

DETAILED DESCRIPTION

Figure 1:
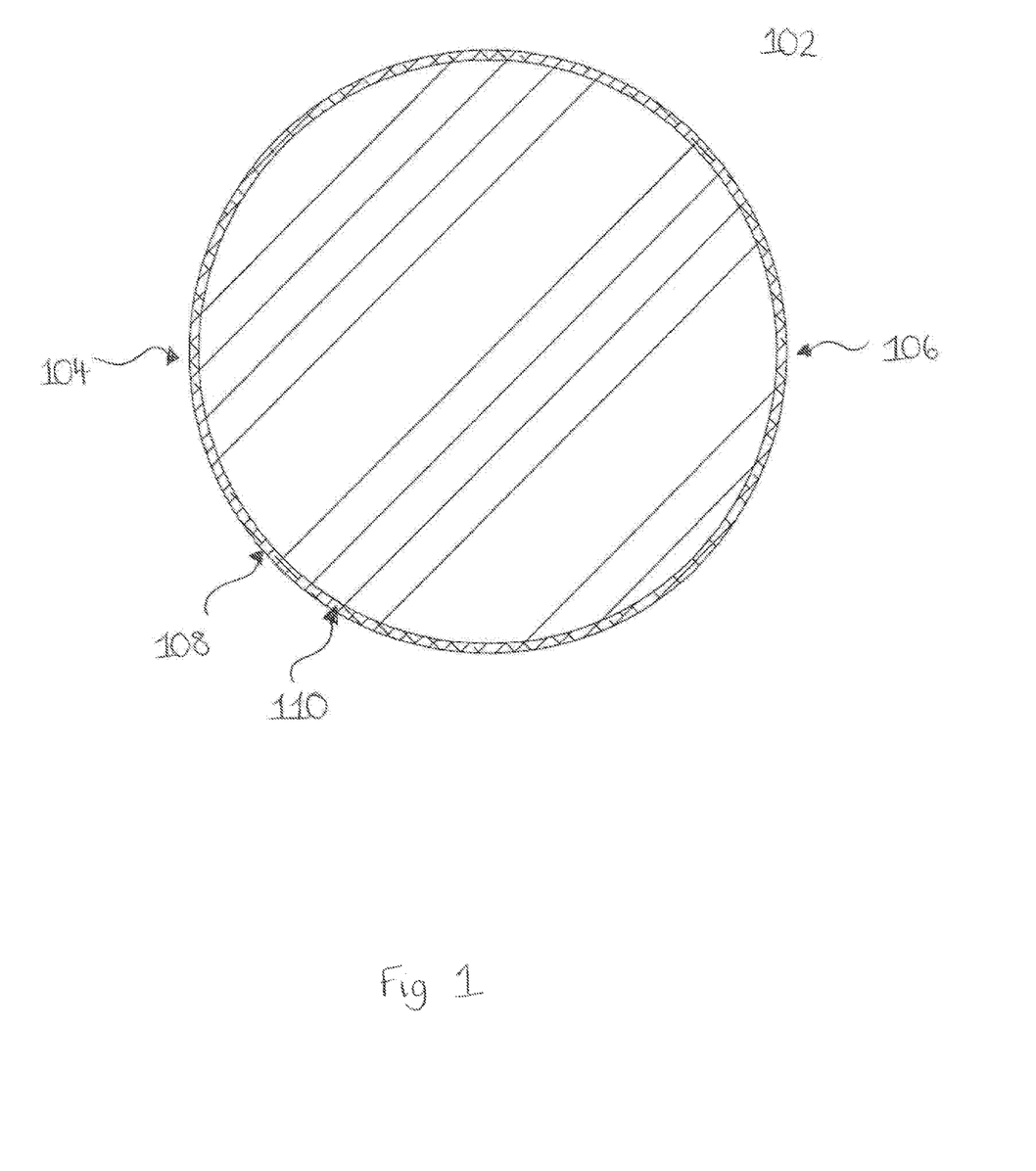
FIG. 1 shows a perspective view of an elastomeric seal having an ink on the upper surface thereof.

Referring to FIG. 1, there is provided an elastomeric seal 102 that is elongate, comprising a longitudinal axis along its length. The elastomeric seal 102 comprises a continuous loop that fits into a channel (not shown) via a friction fit. The elastomeric seal 102 comprises an inner edge 104 and an outer edge 106. The elastomeric seal 102 comprises a lower portion (not shown) and an upper portion (not shown). The lower portion fits into the channel (not shown) via a friction fit and the upper portion (not shown) protrudes from the channel into which the lower portion is fitted. The dimensions of the channel correspond to the dimensions and shape of the lower portion of the elastomeric seal (not shown).

The elastomeric seal 102 is formed from FFKM, however, it will be appreciated by a skilled person that the elastomeric material used to form the elastomeric seal 102 may be varied.

The upper portion (not shown) comprises an upper surface 108 which, when the elastomeric seal is utilised in semiconductor manufacturing apparatus (not shown), is exposed to ultraviolet (UV) radiation. An ink 110 is on the upper surface 108 of the elastomeric seal 102.

Figure 2:
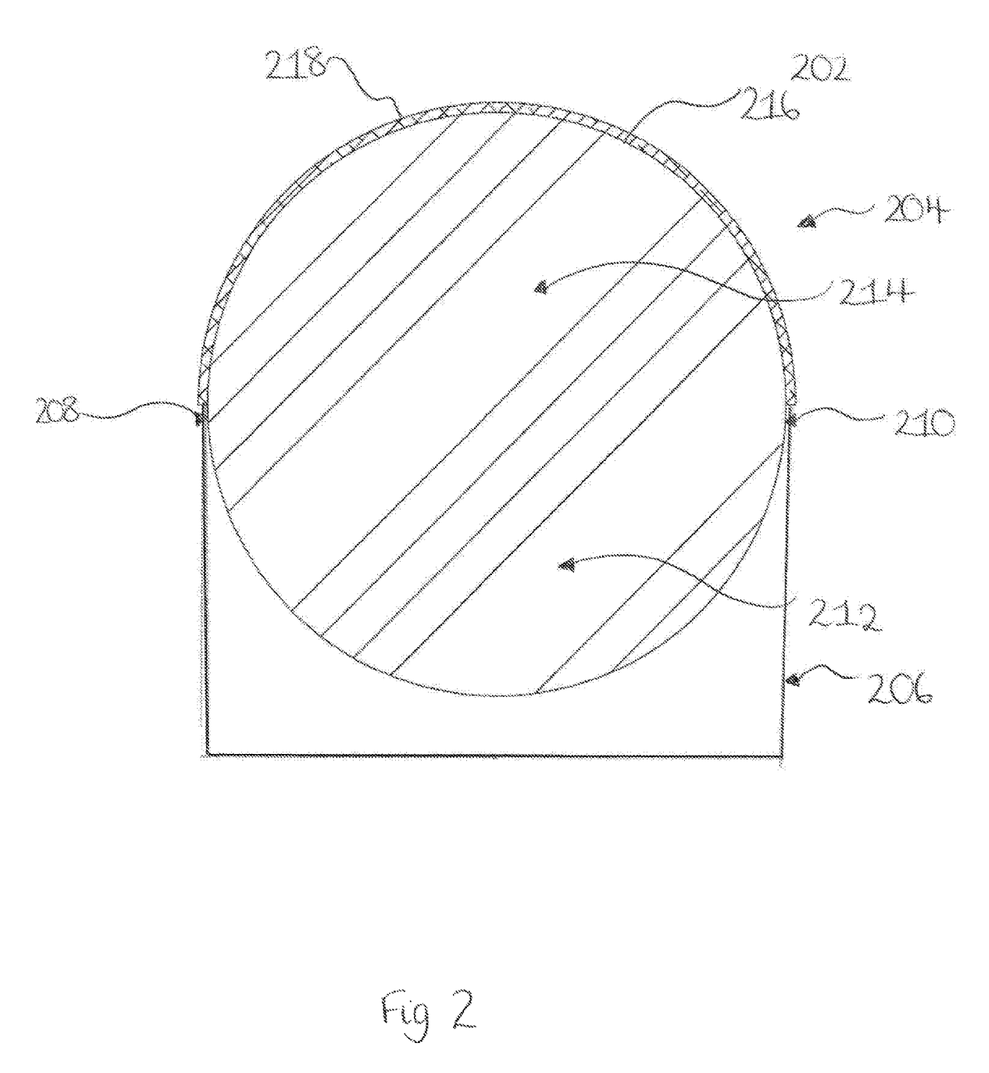
FIG. 2 shows a circular cross sectional view perpendicular to the longitudinal axis of an elastomeric seal having an ink on the upper surface thereof.

Referring to FIG. 2, there is provided a cross section 202 of an elastomeric seal 204 perpendicular to the longitudinal axis (not shown) of the elastomeric seal (204). The elastomeric seal 204 fits into channel 206 via a friction fit. The elastomeric seal 204 comprises an inner edge 208 and an outer edge 210. The elastomeric seal 204 comprises a lower portion 212 and an upper portion 214. The lower portion 212 fits into the channel 206 via a friction fit and the upper portion 214 protrudes from the channel 206 into which the lower portion 212 fits. The dimensions of the channel 206 correspond to the dimensions and shape of the lower portion 212 of the elastomeric seal. The upper portion 214 comprises an upper surface 216. The upper surface is exposed to ultraviolet (UV) radiation when the elastomeric seal is utilised in semiconductor manufacturing apparatus (not shown). An ink 218 is on the upper surface 216 of the upper portion 214 of the elastomeric seal 204.

The cross section 202 of the elastomeric seal 204 perpendicular to the longitudinal axis (not shown) of the elastomeric seal is circular. The elastomeric seal 204 is cylindrical (not shown). The cross section 202 of the elastomeric seal 204 has a diameter that corresponds to the width of the channel 206 into which the lower portion 212 of the elastomeric seal 204 fits.

The elastomeric seal 204 is formed from FFKM, however, it will be appreciated by a skilled person that the elastomeric material used to form the elastomeric seal 204 may be varied.

Figure 3:
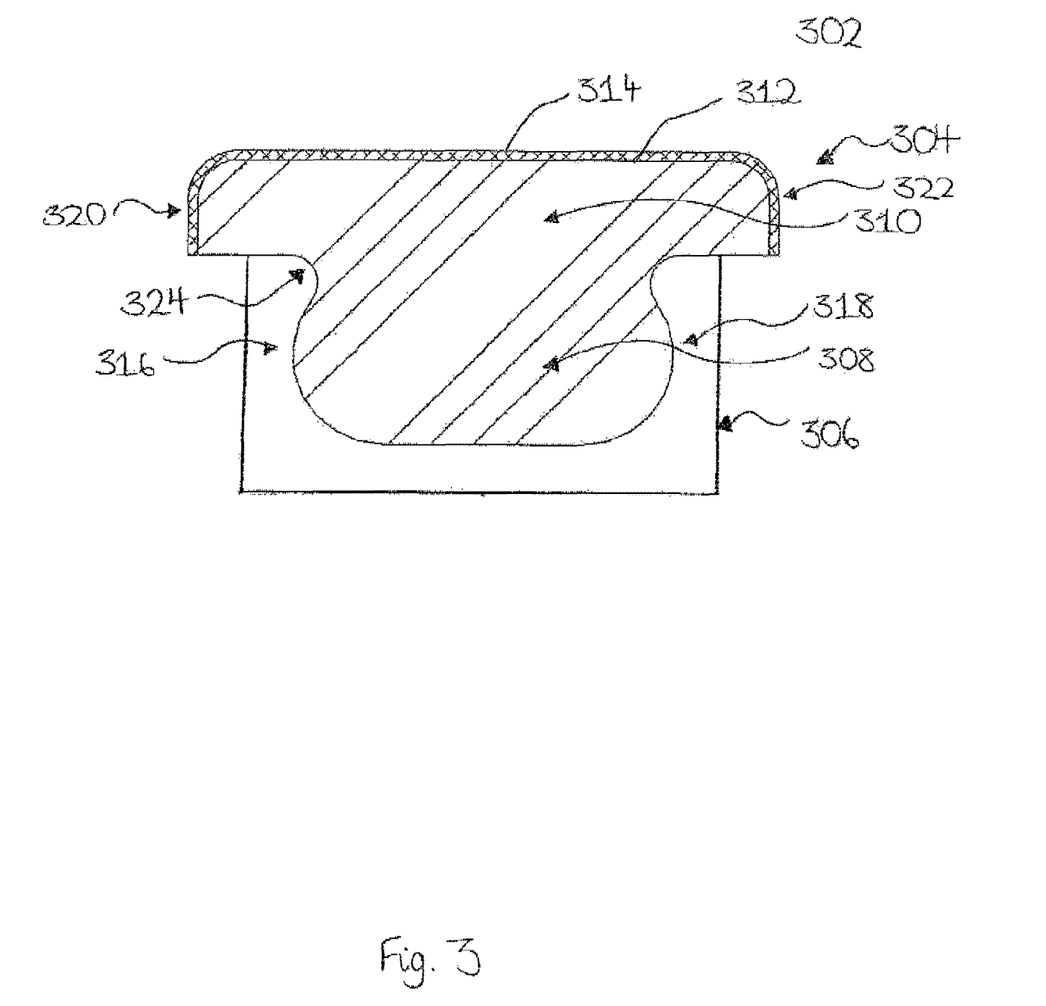
FIG. 3 shows a cross sectional view perpendicular to the longitudinal axis of an elastomeric seal having an ink on the upper surface of the upper portion thereof.

Referring to FIG. 3, there is provided a cross section 302 of an elastomeric seal 304 perpendicular to the longitudinal axis (not shown) of the elastomeric seal 304. The elastomeric seal 304 fits into a channel 306 via a friction fit. The elastomeric seal 304 comprises a lower portion 308 and an upper portion 310. The lower portion 308 fits into the channel via a friction fit and the upper portion 310 protrudes from the channel 306 into which the lower portion 308 fits. The dimension of the channel 306 correspond to the dimensions and shape of the lower portion 308 of the elastomeric seal 304. The upper portion 310 comprises an upper surface 312. The upper surface 312 is exposed to ultraviolet (UV) radiation when the elastomeric seal 304 is utilised in semiconductor manufacturing apparatus (not shown). An ink 314 is on the upper surface 312 of the upper portion 310 of the elastomeric seal 304.

The lower portion 308 of the elastomeric seal 304 is part oval in cross section perpendicular to the longitudinal axis (not shown) of the elastomeric seal 304. The lower portion 308 comprises an inner edge 316 and an outer edge 318.

The upper portion 310 of the elastomeric seal 304 is rectangular in cross section perpendicular to the longitudinal axis (not shown) of the elastomeric seal 304. The upper surface 312 comprises two corners of the upper portion 310 which are curved. The upper portion 310 sits on top of the lower portion 308 to make a conjoined shape. The upper portion 310 comprises an inner edge 320 and an outer edge 322.

The width of the upper portion 310 of the elastomeric seal 304 is wider than the width of the lower portion 308 of the elastomeric seal 304. The point of attachment 324 between the lower portion 308 and the upper portion 310 of the elastomeric seal 304 is narrower than the width of the lower portion 308 of the elastomeric seal 304. The lower portion 308 of the elastomeric seal 304 has a cross section that corresponds to the width of the channel 306 into which the lower portion 308 is fitted. The width of the upper portion 310 is wider than that of the channel 306 into which the lower portion 308 is fitted. The inner edge 320 and the outer edge 322 of the upper portion 310 of the elastomeric seal 304 overlap the edges of the channel 306 into which the lower portion 308 is fitted.

The elastomeric seal 304 is formed from FFKM, however, it will be appreciated by a skilled person that the elastomeric material used to form the elastomeric seal 304 may be varied.

For a better understanding of the invention and to show how embodiments of the same may be carried into effect, reference will now be made, by way of example, to the following experimental data.

EXAMPLES

Ink Compositions

Ink compositions (composition 1 and composition 2) were prepared according to the formulations in Table 1.

TABLE 1

| Ink compositions | | | |
|---|---|---|---|
| | Composition 1 (wt %) | Composition 2 (wt %) | |
| Aluminium flake | 35 | 60 | Barrier material |
| Epoxy acrylate resin binder* | 10 | | Resin binder |
| Tripropylene glycol diacrylate** | | 20 | Resin binder |
| Petroleum spirit (40-60) | 10 | | Solvent |

TABLE 1-continued

| Ink compositions | | |
| --- | --- | --- |
| | Composition 1 (wt %) | Composition 2 (wt %) |
| 1-Propanol | 10 | Solvent |
| Ethanol | 35 | Solvent |
| Cyclohexanone | | 20 Solvent |

*Aliphatic epoxy acylate from Sartomer ® CN152
**Tripropylene glycol diacrylate (TPGDA) from Sartomer ® SR306

The properties of elastomeric seals having the ink compositions (coating compositions 1 and 2) deposited thereon and comparative elastomeric seals without such compositions deposited thereon, were tested via the following methods.

Preparation of Test Substrates:

Compositions 1 and 2 were applied to 20×10×2 mm sheets of elastomeric material at 50 micron thickness, as shown in Table 2.

TABLE 2

| Test substrates | | | | | | |
| --- | --- | --- | --- | --- | --- | --- |
| | Example 1 | Example 2 | Example 3 | Example 4 | Example 5 | Example 6 |
| Ink composition | 1 | 1 | 1 | 2 | 2 | 2 |
| Elastomeric Material | Perlast G67P | V75SC | Nanofluor Y75N | Perlast G67P | V75SC | Nanofluor Y75N |

The same elastomeric materials were exposed to the same conditions without ink compositions 1 and 2 applied thereon, to form comparative examples 1-3.

The sheets were exposed to UV radiation (185-254 nm) for 1100 hours at 75° C. exposed to UV radiation at 2 cm distance under a 600 watt UV source producing 185 and 254 nm wavelength light in a closed/ventilated chamber.

The samples were tested and evaluated for weight, colour, surface and hardness changes before and after exposure to the UV radiation according to the procedures below.

Weight Change:

Weight change of the samples was calculated according to the following formula:

Weight change (%)=((Initial weight−final weight)/Initial weight)*100

Colour Change:

Change in colour was evaluated against a fresh sample of the same elastomeric material having the ink applied thereon. The change was analysed under fluorescent white light.

Surface Change:

Change in surface was evaluated according to the extent of cracking. The change was analysed using a low powered light microscope at 30× and 97× magnification and using a rating of 1 to 5, with 5 being the least degradation.

Hardness Change:

Change in hardness was evaluated according to ASTM D2240 using a Shore A durometer.

The results are shown in Table 3, below.

TABLE 3

| Test Results | | | | |
| --- | --- | --- | --- | --- |
| | Weight change after UV exposure (%) | Colour change after UV exposure | Surface change after UV exposure | Hardness change after UV exposure |
| Example 1 | 2.1 | — | 5 | — |
| Example 2 | 2.4 | — | 5 | — |
| Example 3 | 3.4 | — | 5 | — |
| Example 4 | 1.2 | — | 5 | — |
| Example 5 | 1.6 | — | 5 | — |
| Example 6 | 1.8 | — | 5 | — |
| Comparative example 1 | 6.2 | — | 5 | +2 |
| Comparative example 2 | 6.8 | white to yellow | 1 | +3 |
| Comparative example 3 | 10.2 | translucent to opaque | 2 | +2 |

Surface Change:
5 No Change
4 Slight Change
3 Moderate Change
2 Moderate/Severe Change
1 Severe Change The results demonstrate that the elastomeric seals according to the present invention comprising Aluminium-based ink printed on at least a portion of an upper surface thereof, show less change in the characteristics of the seal, thus demonstrating increased resistance to degradation upon exposure to short wave ultraviolet (UV) radiation than non-coated elastomeric seals. The elastomeric seals according to the present invention therefore have longer lifetimes when utilised in semiconductor processing apparatus and processes.

Attention is directed to all papers and documents which are filed concurrently with or previous to this specification in connection with this application and which are open to the public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination of the features disclosed in this specification (including any accompanying claims, abstract or drawings), or to any novel one, or any novel combination of the steps of any method or process so disclosed.

The invention claimed is:

1. An elastomeric seal for use in semiconductor manufacturing apparatus comprising an ink printed on at least a portion of the upper surface thereof, wherein the ink comprises a barrier material and a binder, the barrier material being operable to prevent or reduce degradation of the elastomeric seal from ultraviolet (UV) radiation.

2. An elastomeric seal according to claim 1, wherein the seal is generally elongate, preferably comprising a continuous loop operable to fit into a channel.

3. An elastomeric seal according to claim 2, wherein the elastomeric seal comprises a lower portion and an upper portion, wherein the lower portion is operable to fit into a channel via friction fit.

4. An elastomeric seal according to claim 3, wherein the upper portion of the elastomeric seal protrudes from the channel into which the lower portion is operable to fit and which upper portion may be exposed to UV radiation, in use.

5. An elastomeric seal according to claim 1, wherein in the elastomeric seal is to be a simple O-ring, face seal, lip seal, D-seal, X seal T-Seal, cap seal, wiper seal, energising lip seal or spring seal or wafer handling elastomeric parts such as end effector pads or suction cups.

6. An elastomeric seal according to claim 1, comprising a polymeric material comprising one or more fluoropolymer materials, respectively comprising one or more homopolymers or copolymers derived from combinations of monomers comprising fluorine.

7. An elastomeric seal according to claim 1, wherein the barrier material comprises metallic particles.

8. An elastomeric seal according to claim 7, wherein the metallic particles include one or more of the following: aluminium, silver, nickel, titanium, zinc, gold and copper.

9. An elastomeric seal according to claim 7, wherein the metallic particles are incorporated into the ink in the form of flakes.

10. An elastomeric seal according to claim 7, wherein the metallic particles have an average particle size of from about 0.5 to 75 microns.

11. An elastomeric seal according to claim 1, wherein the barrier material comprises inorganic compounds.

12. An elastomeric seal according to claim 11, wherein the inorganic compounds include one or more of the following: titanium dioxide, aluminium dioxide, carbon black.

13. An elastomeric seal according to claim 11, wherein the inorganic compounds have an average particle size of from about 0.1 to 10 microns.

14. A method of forming an elastomeric seal for use in semiconductor manufacturing apparatus comprising printing an ink on at least a portion of an upper surface thereof, wherein the ink comprises a barrier material and a binder, the barrier material being operable to prevent or reduce degradation of the seal from ultraviolet (UV) radiation.

15. A method of preventing or reducing degradation of an elastomeric seal by ultraviolet (UV) radiation, the method comprising printing an ink on at least a portion of an upper surface of the said elastomeric seal, wherein the ink comprises a barrier material and a binder, the barrier material being operable to prevent or reduce degradation of the elastomeric seal from ultraviolet (UV) radiation.

* * * * *